United States Patent
Gara et al.

(10) Patent No.: US 7,532,700 B2
(45) Date of Patent: *May 12, 2009

(54) SPACE AND POWER EFFICIENT HYBRID COUNTERS ARRAY

(75) Inventors: Alan G. Gara, Mount Kisco, NY (US); Valentina Salapura, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 219 days.

This patent is subject to a terminal disclaimer.

(21) Appl. No.: 11/507,310

(22) Filed: Aug. 21, 2006

(65) Prior Publication Data

US 2008/0043899 A1 Feb. 21, 2008

(51) Int. Cl.
*G06M 3/00* (2006.01)
(52) U.S. Cl. .......................................... 377/26; 377/37
(58) Field of Classification Search ....................... None
See application file for complete search history.

(56) References Cited

U.S. PATENT DOCUMENTS

| | | | | |
|---|---|---|---|---|
| 4,839,909 A * | 6/1989 | Warner | ...................... | 377/24.1 |
| 5,164,969 A * | 11/1992 | Alley et al. | ................... | 377/39 |
| 5,301,219 A * | 4/1994 | Cronyn | ......................... | 377/44 |
| 5,367,550 A * | 11/1994 | Ishida | .......................... | 377/39 |
| 5,615,135 A | 3/1997 | Waclawsky et al. | | |
| 5,687,173 A | 11/1997 | Melden et al. | | |
| 6,078,637 A * | 6/2000 | Ansel et al. | .................... | 377/26 |
| 6,249,562 B1 * | 6/2001 | Wells | .......................... | 377/26 |
| 6,360,337 B1 * | 3/2002 | Zak et al. | ...................... | 714/47 |
| 6,567,340 B1 | 5/2003 | Nataraj et al. | | |
| 6,658,584 B1 | 12/2003 | Bass et al. | | |
| 6,922,456 B2 * | 7/2005 | Greenlaw et al. | ............. | 377/26 |
| 7,003,067 B1 * | 2/2006 | Younis | ......................... | 377/46 |
| 7,272,754 B2 * | 9/2007 | Love et al. | ..................... | 714/47 |
| 2005/0262333 A1 | 11/2005 | Gat | | |
| 2006/0133560 A1 * | 6/2006 | Takagi | ......................... | 377/82 |

OTHER PUBLICATIONS

IShah et al., "Maintaining Statistics Counters in Router Line Cards", IEEE Micro 2002, pp. 76-81.

* cited by examiner

*Primary Examiner*—Cassandra Cox
(74) *Attorney, Agent, or Firm*—Scully, Scott, Murphy & Presser, P.C.; Daniel P. Morris, Esq

(57) ABSTRACT

A hybrid counter array device for counting events. The hybrid counter array includes a first counter portion comprising N counter devices, each counter device for receiving signals representing occurrences of events from an event source and providing a first count value corresponding to a lower order bits of the hybrid counter array. The hybrid counter array includes a second counter portion comprising a memory array device having N addressable memory locations in correspondence with the N counter devices, each addressable memory location for storing a second count value representing higher order bits of the hybrid counter array. A control device monitors each of the N counter devices of the first counter portion and initiates updating a value of a corresponding second count value stored at the corresponding addressable memory location in the second counter portion. Thus, a combination of the first and second count values provide an instantaneous measure of number of events received.

8 Claims, 14 Drawing Sheets

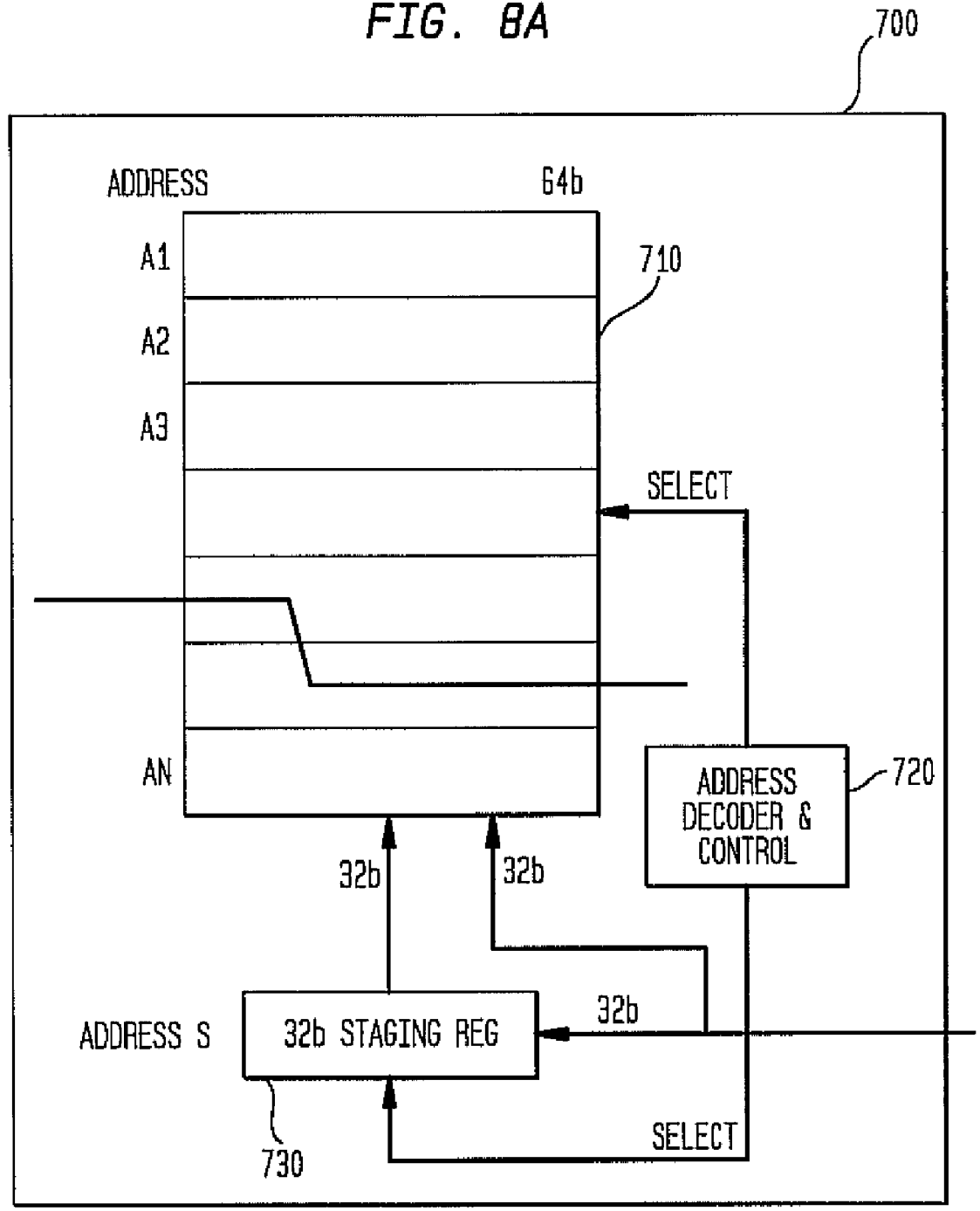

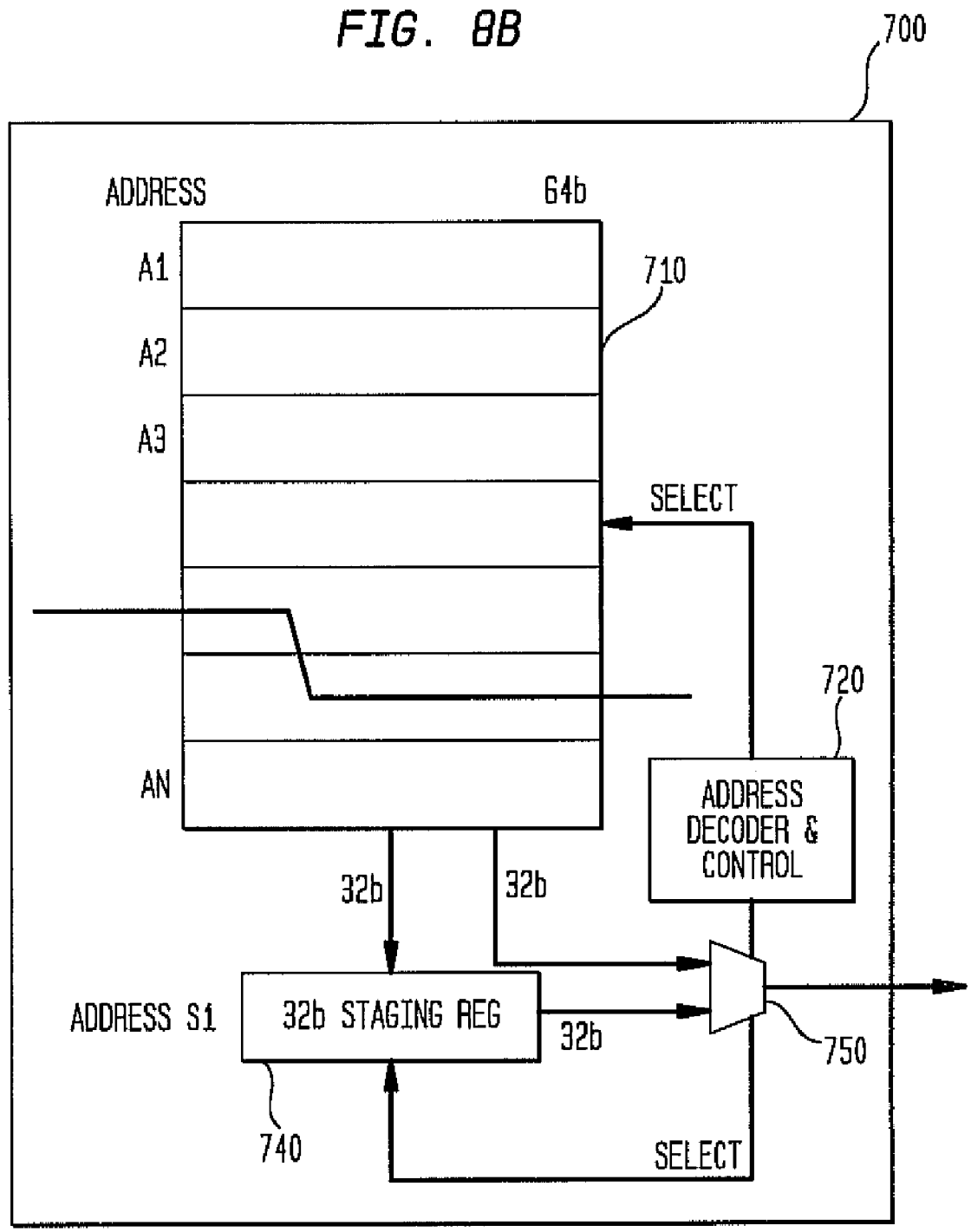

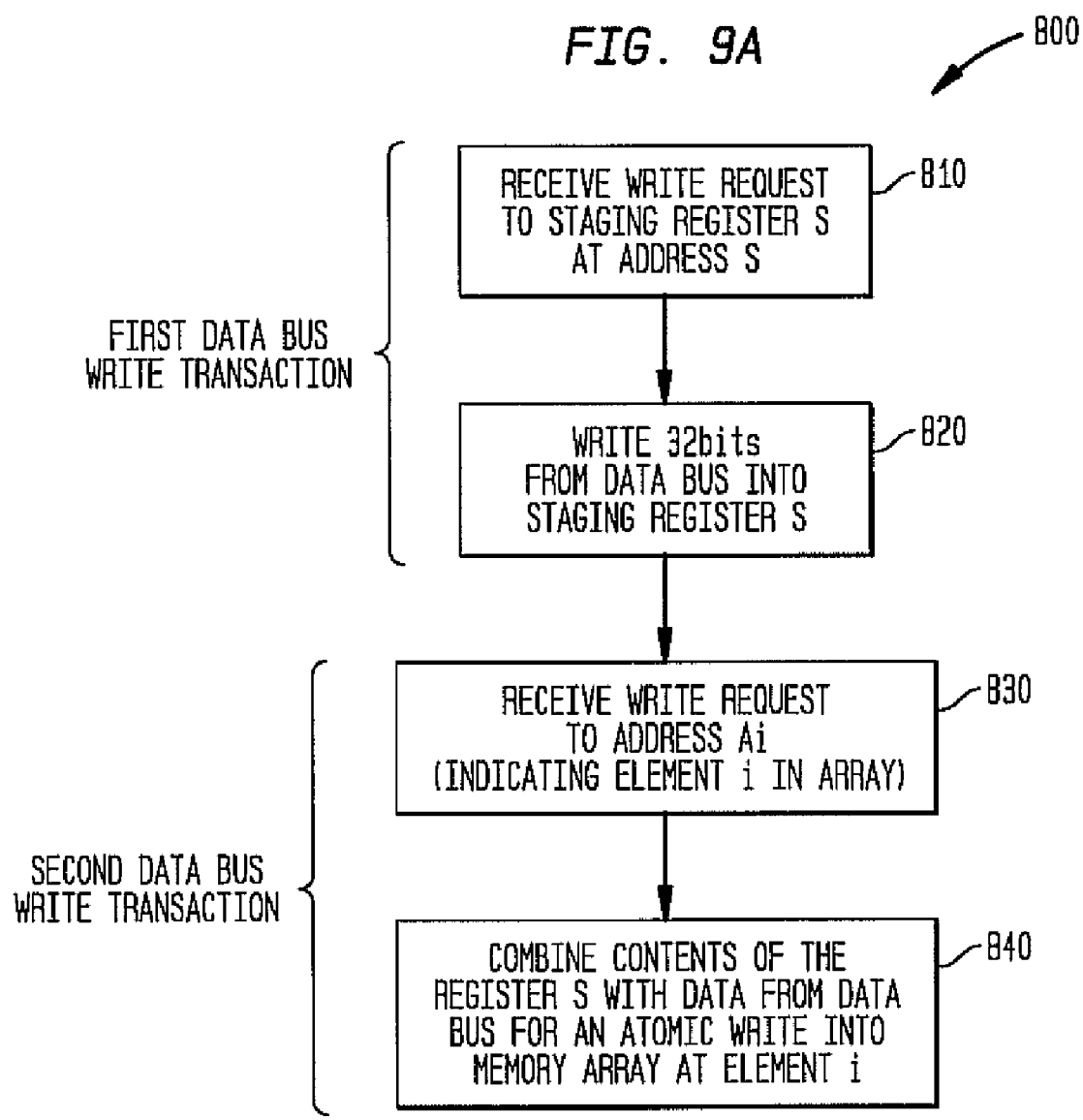

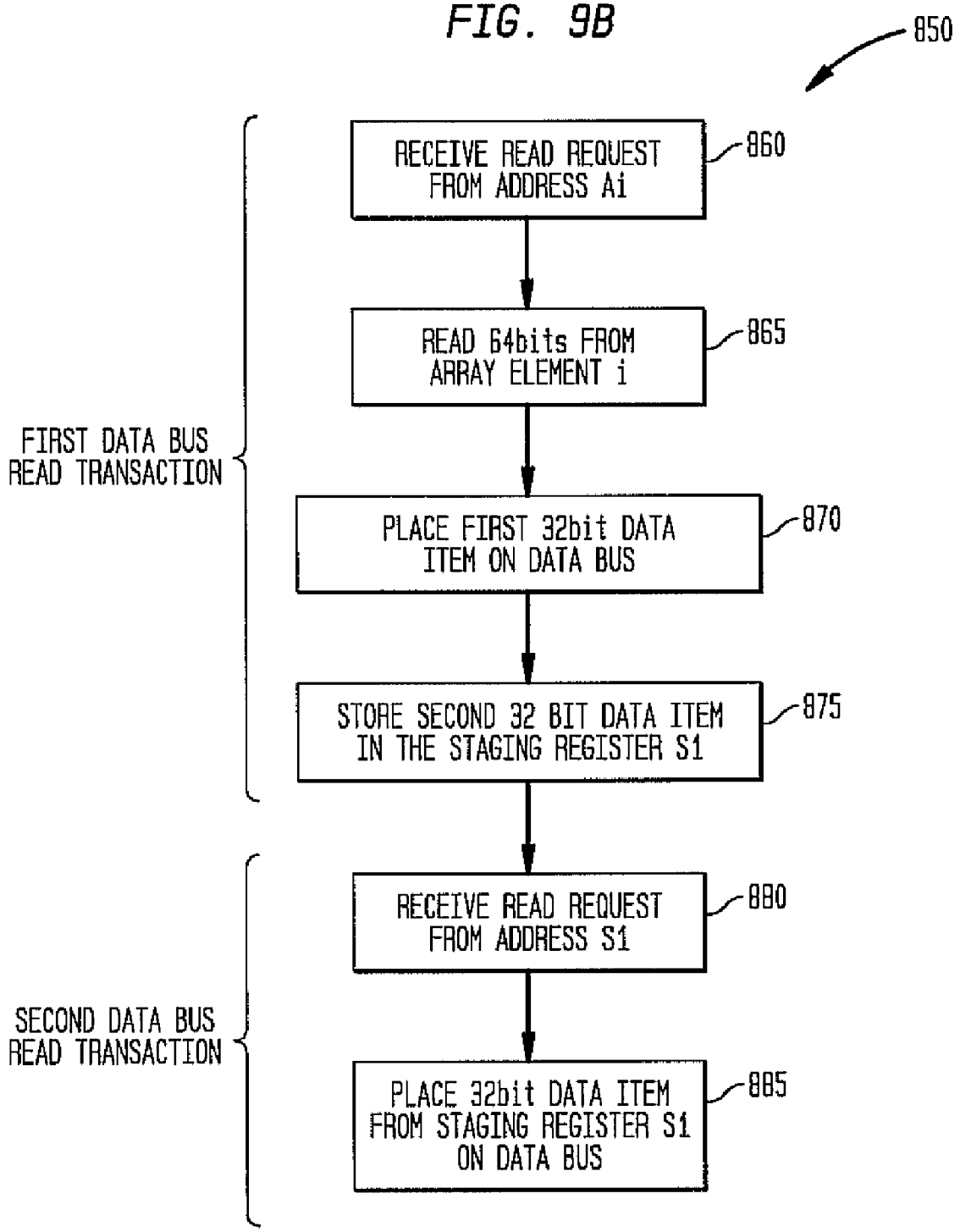

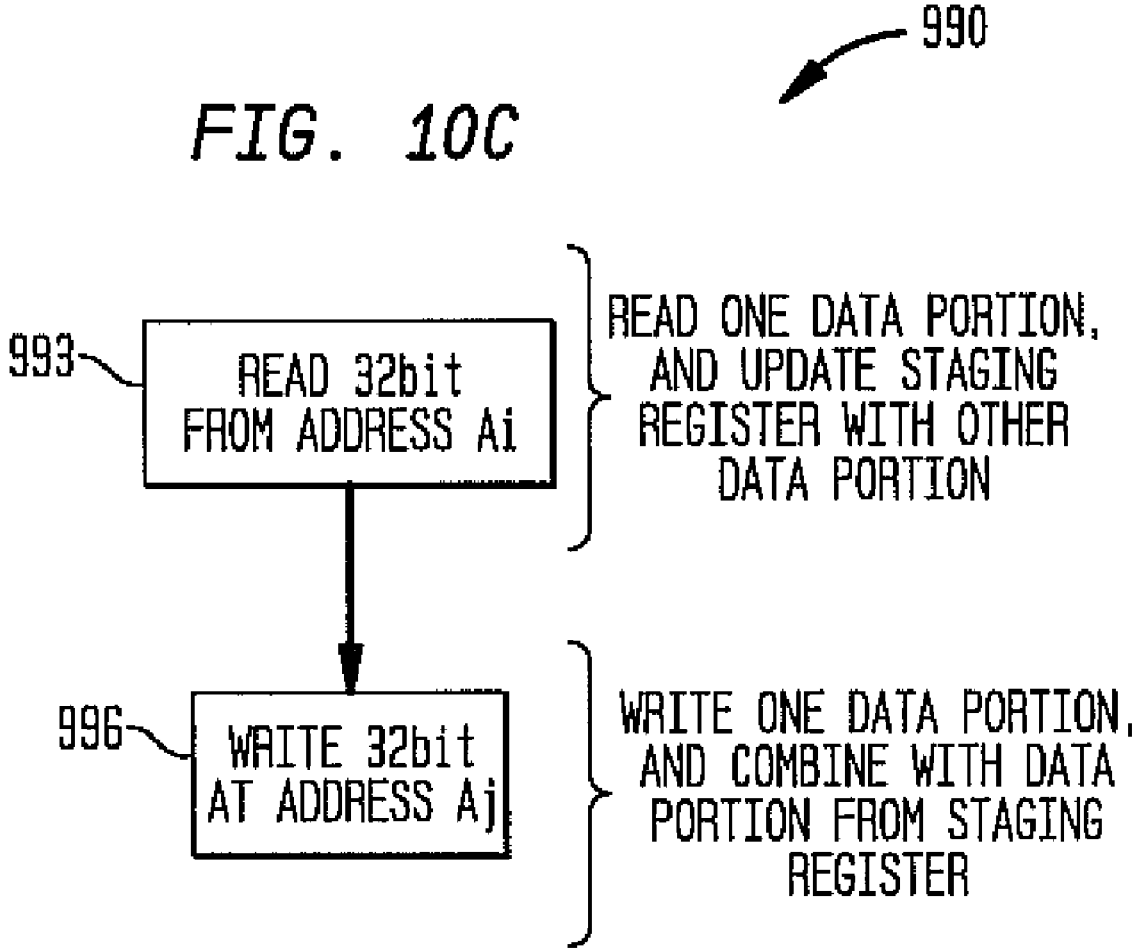

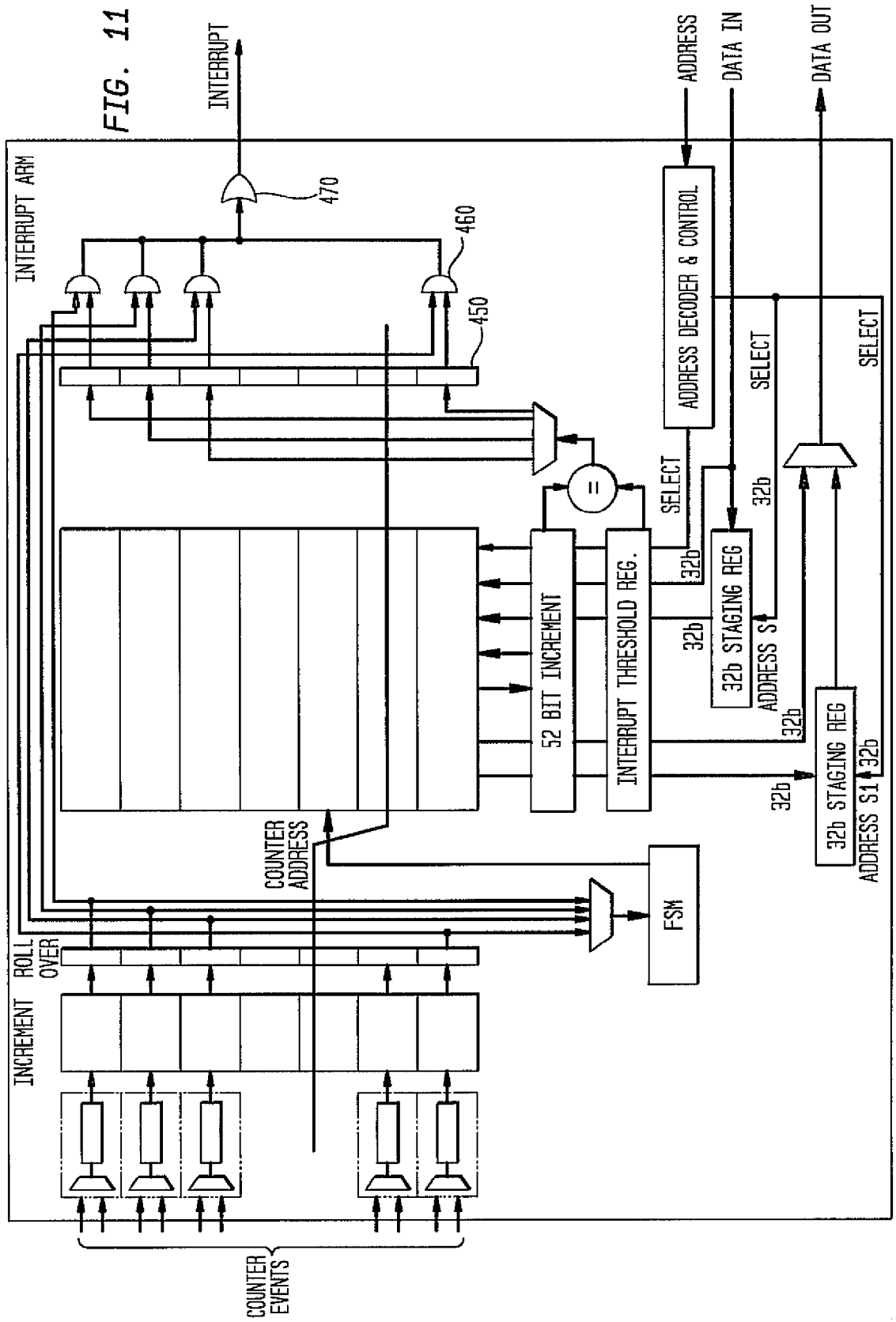

US 7,532,700 B2

SPACE AND POWER EFFICIENT HYBRID COUNTERS ARRAY

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract. No. B542702 awarded by the Department of Energy.

CROSS-REFERENCE TO RELATED APPLICATIONS

The present application relates to commonly-owned, co-pending U.S. patent applications Nos. 11/507,308, 11/507,306 and 11/507,307, each of which was filed on even date herewith.

BACKGROUND OF THE INVENTION

1. Field of the Invention

The present invention generally relates to computer systems using single or multiprocessor architectures and, more particularly, to a novel implementation of performance counters for recording occurrence of certain events. In even more particular aspect, this invention relates to managing the counting of large number of individual events in a computer system.

2. Description of the Prior Art

Many processor architectures include on a chip a set of counters that allow counting a series of processor events and system events on the chip, such as cache misses, pipeline stalls and floating point operations. This counter block is referred to as "performance counters".

Performance counters are used for monitoring system components such as processors, memory, and network I/O. Statistics of processor events can be collected in hardware with little or no overhead from operating system and application running on it, making these counters a powerful means to monitor an application and analyze its performance. Such counters do not require recompilation of applications.

Performance counters are important for evaluating performance of a computer system. This is particularly important for high-performance computing systems, such as BlueGene/P, where performance tuning to achieve high efficiency on a highly parallel system is critical. Performance counters provide highly important feedback mechanism to the application tuning specialists.

Many processors available, such as UltraSPARC and Pentium provide performance counters. However, most traditional processors support a very limited number of counters. For example, Intel's X86 and IBM PowerPC implementations typically support 4 to 8 event counters. While typically each counter can be programmed to count specific event from the set of possible counter events, it is not possible to count more than N events simultaneously, where N is the number of counters physically implemented on the chip. If an application tuning specialist needs to collect information on more than N processor, memory or I/O events, he has to repeat execution of the application several times, each time with different setting of performance counters.

While this is time consuming, the collected statistics can also be inaccurate, as various application runs can have different set of events, because of different conditions such as initial condition of memory, preloaded caches, etc. This is especially true for multiprocessor applications.

The main reason for not including a large number of counters on a processor chips is that their implementations are large in area and cause high-power dissipation. Frequently, not only large number of counters is needed, but also the counters have to be large themselves (for example, having 64 bits per counter) to avoid overflowing and wrapping around during the application run.

It would be highly desirable to have an implementation of event counters which is able to support a large number of tracked events simultaneously, which is compact in area and having low power. This is especially important for systems on a single chip with limited area and power budget.

A reference entitled "Maintaining statistics counters in router line cards" published in IEEE Micro 2002 by D. Shah, S. Iyer, B. Prabhakar, and N. McKeown describe implementation of large counter array for network routers. The counters are implemented using SRAM memory for storing m lower counter bits for N counters, and DRAM memory for storing N counters of width M, and m<M. The SRAM counters track the number of updates not yet reflected in the DRAM counters. Periodically, DRAM counters are updated by adding the values in the SRAM counters to the DRAM counters, as shown in FIG. 1. This implementation limits the speed of events which can be recorded to be at most the speed of updating SRAM memory. Whereas this is sufficient for tracking network traffic, this implementation is too slow to be useful for processor performance counters. Also, while network traffic is necessarily serial—limited by a communication line—multiple events occur in pipelined processor architecture simultaneously every cycle, making this implementation inappropriate for processor system performance counters.

In the prior art, the following patents address related subject matter to the present invention, as follows:

U.S. Pat. No. 5,615,135 describes implementation of a reconfigurable counter array. The counter array can be configured into counters of different sizes, and can be configured into groups of counters. This invention does not teach or suggest a system and method for using SRAM for implementing counter arrays.

U.S. Pat. No. 5,687,173 describes an implementation of a counter array useful for network switches. The implementation employs a register array for implementing large number of event counters. This invention does not teach or suggest a system and method for using SRAM for implementing counter arrays. SRAM based implementation for counter arrays of the same size is of higher density and lower power dissipation, compared to register array based counter implementation. Additionally, register array based implementation with N registers can update at most n counters simultaneously, with n being number of write ports to the register array, and n<<N. This makes register array based counter array implementation unsuitable for processor system performance counters.

U.S. Pat. No. 6,567,340 B1 describes an implementation of counters using memory cells. This invention teaches usage of memory cells for building latches. These latches with embedded memory cells can than be used for building counters and counters arrays. This patent does not teach or suggest a system and method for using SRAM or DRAM memory arrays for implementing counter arrays.

U.S. Pat. No. 6,658,584 describes implementation of large counter arrays by storing inactive values in memory, and referencing the proper counters by employing tables. On a counter event, the table is referenced to identify the memory location of the selected counter, and the counter value is read from the memory location, updated and stored back. The access to counters is managed by bunk of several processors, which identify events, and counter manager circuitry, which updates selected counters. This patent does not teach hybrid implementation of counters using latches and memory arrays, and has too low latency to be able to keep up with monitoring simultaneous events in a single processor.

U.S. Patent Application No. 2005/0262333 A1 describes an implementation of branch prediction unit which uses array to store how many loop iterations each loop is going to be executed to improves branch prediction rate. It does not teach how to implement counters using both latches and memory arrays.

None of the prior art provides a solution to the problem of implementing a large number of high-speed counters able to track events simultaneously, which is compact in area and with low power. It would be highly desirable to provide a simple and efficient hardware device for counting simultaneously large number of individual events in a single or multiprocessor computer system.

SUMMARY OF THE INVENTION

It is therefore an object of the present invention to provide a novel implementation of large counter arrays for counting simultaneously large number of individual events in a single or multiprocessor system. The invention teaches counter array implementation which is compact in area, and is low power implementation which scales well with high number of simultaneously counted events. The invention teaches implementation of counter array by using both latches and memory arrays for implementing large number of large counters. In this hybrid counter implementation, a number of n least significant bits of a counter are implemented using discrete registers, whereas the N−n most significant bits of counters are stored in a memory array, where N is the number of bits in a counter.

It is a further object of the present invention to provide a method and apparatus for effectively reducing the area required to implement large array of large counters by using a memory array, such as SRAM or DRAM arrays for implementing higher bits of large counters, and by using latches to implement lower bits of counters. Updating of the memory array is performed periodically, and is controlled by a state machine. The counter array taught here is significantly smaller than a discrete-register based counter array implementation. Reducing the area requirements for event counter arrays in a single or multiprocessor system enables tracking of much larger number of events with reduced power. Large number of event statistics is then used to tune applications to increase application performance and ultimately, system performance. Performance counters provide highly important feedback mechanism to the application tuning specialists. This is particularly important for high-performance computing systems, where applications are carefully tuned to achieve high efficiency on a highly parallel system.

Thus, in accordance with the invention, there is provided a hybrid counter array device and methodology for counting events. The hybrid counter array device comprises:

a first counter portion comprising N counter devices, each counter device for receiving signals representing occurrences of events from an event source and providing a first count value corresponding to a lower order bits of the hybrid counter array;

a second counter portion comprising a memory array device having N addressable memory locations in correspondence with the N counter devices, each addressable memory location for storing a second count value representing higher order bits of the hybrid counter array; and, a control means for monitoring each of the N counter devices of the first counter portion and initiating updating a value of a corresponding second count value stored at the corresponding addressable memory location in the second counter portion, wherein a combination of the first and second count values provide instantaneous measure of number of events received.

In the hybrid counter array device, each counter device preferably comprises a discrete element. Moreover, in the hybrid counter array device, each said counter device may comprise an incrementable register device. Preferably, in the hybrid counter array device the memory array device comprises one or more of: an SRAM, a DRAM or embedded DRAM.

Further, in one implementation of the hybrid counter array device, the control means comprises a finite state machine that monitors all N counter devices in a cycle.

In a further embodiment of the hybrid counter array device, there is provided an overflow bit means associated with each respective N counter device of the first counter portion, the overflow bit means being set in response to an associated counter device reaching overflow condition. Thus, further to the embodiment employing an overflow bit means, the control means further monitors each of the N associated overflow bit means of the first counter portion and initiates incrementing a value of a corresponding second count value stored at the corresponding addressable memory location in the second counter portion in response to a respective overflow bit being set.

BRIEF DESCRIPTION OF THE DRAWINGS

The objects, features and advantages of the present invention will become apparent to one skilled in the art, in view of the following detailed description taken in combination with the attached drawings, in which:

FIG. 8 depicts a high level block diagram of a wide memory array implementation with support for memory accesses via a narrow bus in accordance with the present invention with FIG. 8A depicting a memory write operation, and FIG. 8B depicting a memory read operation;

FIGS. 9A and 9B depict methods implemented in hardware for respectively writing and reading data elements of a memory array according to the invention;

FIGS. 10A, 10B, and 10C, depict methods implemented in software for respectively writing data elements, reading data elements, and performing a read-modify-write cycle on data elements of a memory array according to the invention; and, FIG. 11 depicts an apparatus 1000 including the hybrid counter unit of the invention as a combination of the individual system components as depicted in FIGS. 2, 4, 5 and 8A and 8B.

DETAILED DESCRIPTION OF THE PREFERRED EMBODIMENTS

Figure 1:
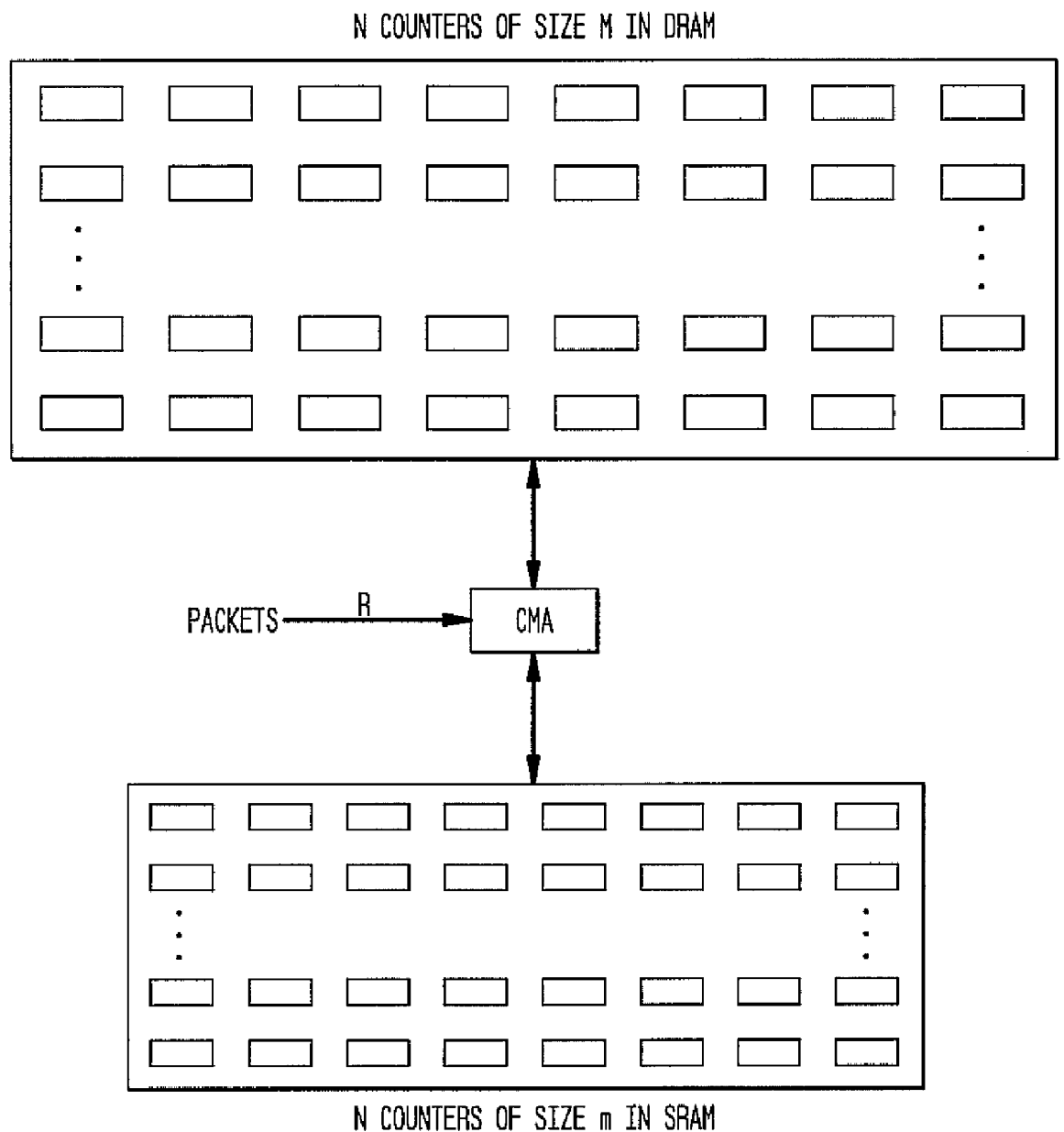
FIG. 1 depicts a counter array implementation according to the prior art using SRAM memory for storing m lower counter bits for N counters, and DRAM memory for storing N counters of width M, and m<M. Periodically, DRAM counters are updated by adding the values in the SRAM counters to the DRAM counters.
Figure 2:
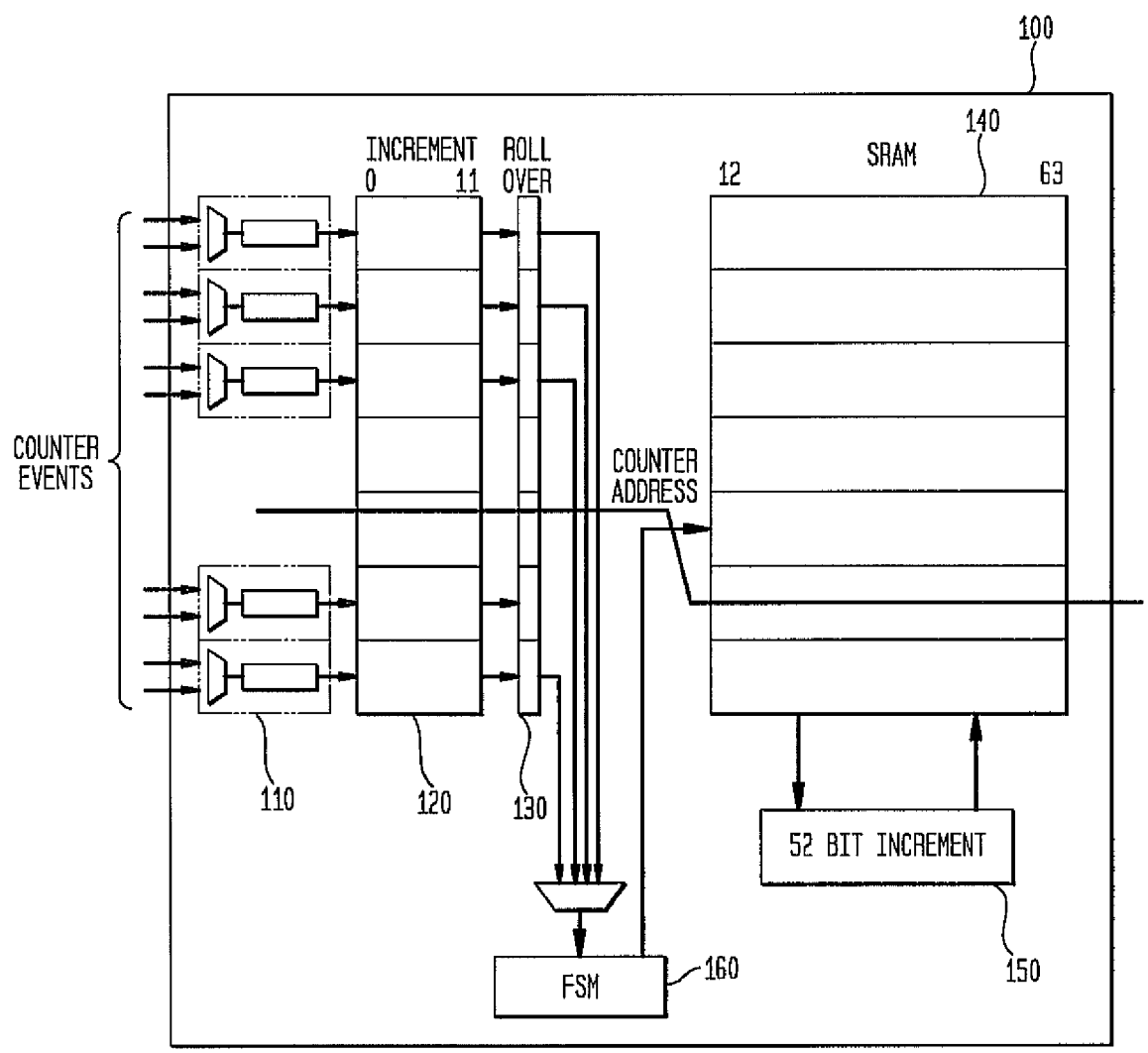
FIG. 2 depicts on example embodiment of this invention, where 12 least significant bits of a counter are implemented using discrete registers, and a remaining 52 most significant bits of counters are stored in a SRAM memory array.

Referring now to drawings, and more particularly to FIG. 2, there is depicted the preferred embodiment of the invention. The performance counter unit 100 includes N counter devices. The N counter events to monitor are selected from a set of M events selected by the set of N multiplexers 110. The selected performance events are counted in the counter block 120, which implements N counters which are n width representing n least significant bits of a counter. The counters in the block 120 are implemented using discrete registers. In the preferred embodiment, the block 120 implements only lowest 12 bits of 64-bit counters, but it known to skilled artisans that any number of lower bits can be counted in the discrete register logic block.

When a counter from the counter block 120 reaches its maximum, its value rolls over to zero, the corresponding bit in the "roll over bit" block 130 is set, and the counter continues to track performance events.

The K−n most significant bits of counters are stored in a memory array block 140, where K is the number of bits in a counter. Thus, the dimensions of the memory array block 140 is N×(K−n) bits. The size of the memory array will be increased for additional bits needed if it implements parity protection scheme, or ECC memory protection. In the illustrated embodiment, to implement 64-bit wide counters, the memory array contains 52 most significant bits, whereas the 12 least significant bits are stored in the counters using discrete logic.

In the preferred embodiment, the memory array 140 is implemented using SRAM memory array. It is understood that one skilled in the art may implement memory array using DRAM memory array, or some other memory array without departing from the scope of the invention.

It is to be understood, in yet another embodiment, that instead of using one memory array block to implement all higher significance bits of the counter arrays, multiple memory arrays can be used without departing from the scope of the invention. In a multiple array embodiment, counter bits can be split vertically across multiple memory arrays (so that m1 bits are contained in the memory array M1, m2 bits are contained in the memory array M2, etc.), horizontally across multiple memory arrays (thus the first n1 counters are contained in the memory block N1, the next n2 counters are contained in the memory block N2, etc.), or some combination of the two.

In yet another embodiment, hierarchical arrangement of multiple memory arrays using different types of memory arrays can be used without departing from the scope of this invention. In the example embodiment, the lowest n1 bits of the counters can be implemented using discrete logic, the next n2 bits can be implemented using low latency memory array like SRAM, and the next n3 bits using the longer latency memory array like DRAM, etc.

It is to be understood that in yet another embodiment all combinations described above can be used simultaneously, i.e., hierarchical multiple memory block arrangement, and horizontal and vertical splitting of counter bits and counters across multiple memory blocks, without departing from the scope of the invention.

Referring back to FIG. 2, controlled by the control unit 160, each memory elements is accessed and—if the "roll over bit" associated to that counter is set, this memory element is incremented in the increment block 150, and the incremented counter value is stored back to the memory array.

In the preferred embodiment, the control unit is implemented as a simple finite state machine, which cycles through all N counters, from 0 to N−1 in a loop. For each counter, the "roll over bit" is checked, and if this bit is set, the paired counter value is fetched from the memory array 140, incremented in the increment unit 150, and stored back to the memory array, whereas the "roll over bit" is cleared.

In yet another embodiment, the control unit implements some other counter selection scheme to select counter from the memory array for updating counter value without departing from the scope of this invention.

Figure 3:
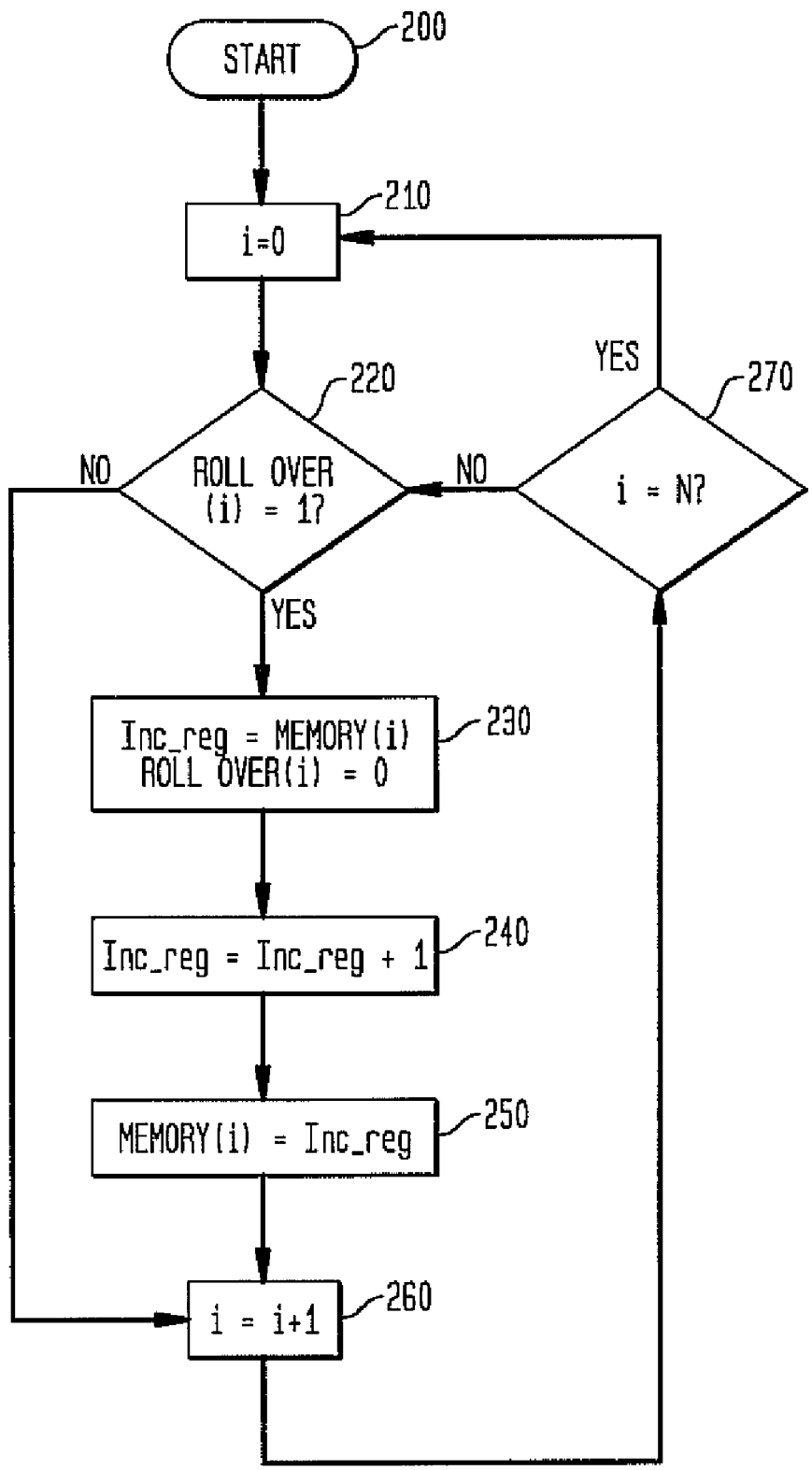
FIG. 3 depicts a flow chart for updating the highest significant bits of hybrid counters located in a memory array in accordance with a preferred embodiment of the invention.

Referring now to FIG. 3, the flow chart depicts the control flow for updating the most significant part of a hybrid counter located in the said memory array. At the start of operation at step 200 the variable i loop counter is set to zero as indicated at step 210. Then, for each counter is checked if the "roll over" bit is set. This is done one at a time, by checking the value of the "roll over" bit of the counter i, for the current variable i, at step 220.

If the "roll over' bit of the counter i is set, the memory array corresponding to i-th counter is loaded in the increment register, as indicated at step 230. Also in this step, the "roll over" bit of the i-th counter is cleared. The variable i is used to address the corresponding memory location. At step 240, the value loaded in the increment register is incremented, and at step 250 the new value from the increment register is stored back to the memory location corresponding to the i-th counter, addressed by the variable i.

If the 'roll over' bit of the counter i is not set—as determined at step 220-, the execution proceeds to step 260, to increment the variable i and check the next counter.

The execution continues by incrementing the loop variable i at step 260, and checking if all N counters have been addressed at step 270. If all N counters have already been addressed, the loop variable i is reset to zero at step 210. If not all counters have been checked for roll over bit, the operation from steps 220-260 is repeated for the next counter.

In the preferred embodiment, the value of the i-th counter is incremented at step 240. In yet another embodiment, this value can be decremented, or some value different than one can be added or subtracted from the counter without departing from the scope of this invention.

In the preferred embodiment, if the "roll over" bit is not set, the control continues from the step 220 to 260 directly. In yet another embodiment, the control can go true one or more "idle" steps, so that the number of cycles spent in one iteration of the control loop is the same for a counter which updates its value to a counter where no updates are needed, without departing from the scope of this invention.

Figure 4:
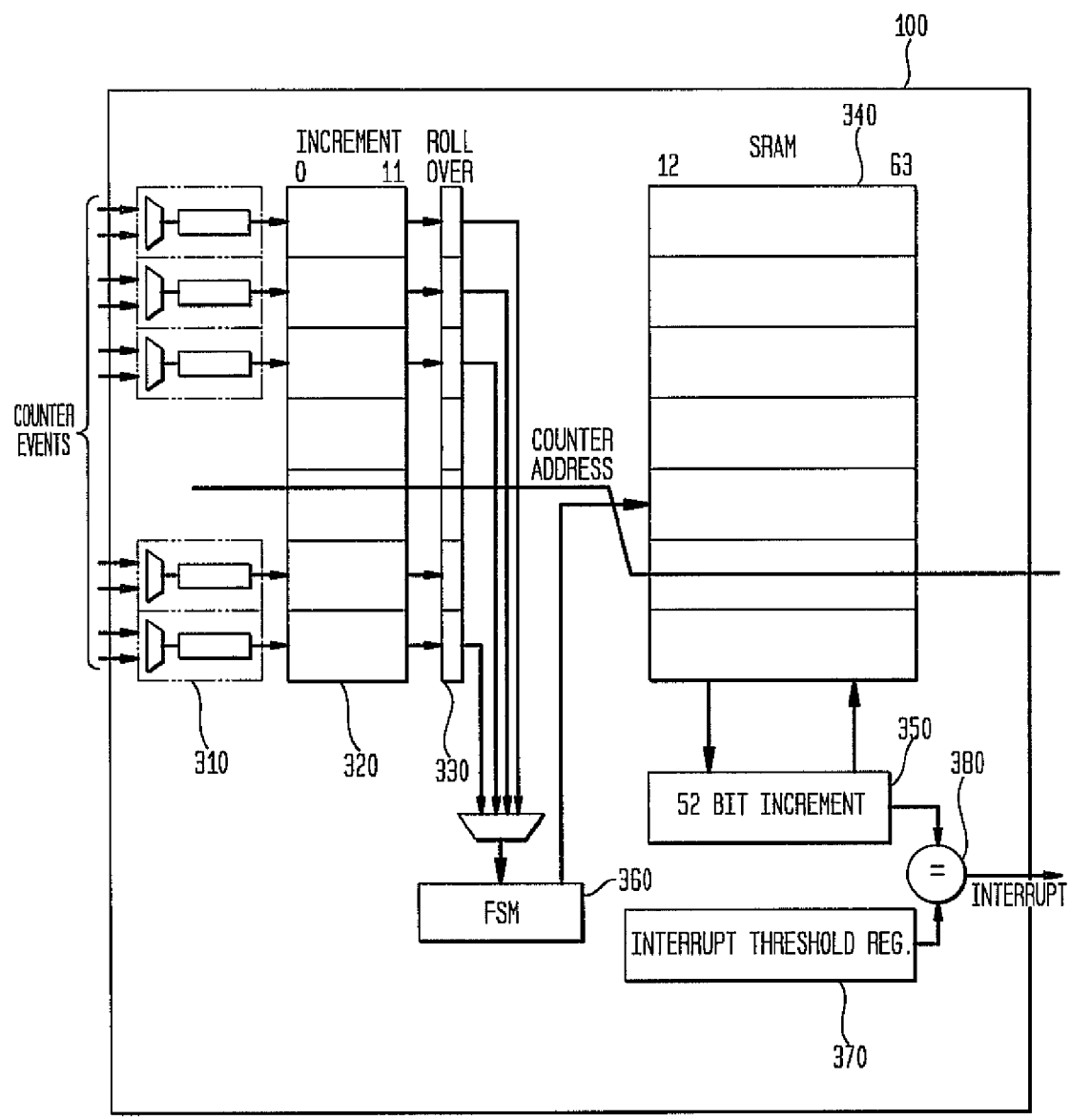
FIG. 4 depicts a high level schematic of a hybrid counter implementation with added support for interrupt indication in accordance with a preferred embodiment of the invention.

Referring now to FIG. 4, there is depicted a high level block diagram for the hybrid counter implementation with added support for interrupt indication in accordance with a preferred embodiment of the invention. In addition to the said components of the counter 310-360, one interrupt threshold register 370 and the comparison logic 380 is added. This interrupt threshold register is set to desired value by using write interface from one or more processors to set it to predefined value.

The interrupt indication operates as follows: for each counter, if the corresponding "roll over" bit is set, the counter value is retrieved out of the memory array in the increment register 350. The register value 350 is incremented, and the resulting value is stored back to the memory array. In parallel, the incremented counter value in the increment register 350 is compared to the interrupt threshold value stored in the interrupt threshold register 370 by the comparison logic 380. If these two values are identical, the "interrupt" signal is set, otherwise, it remains zero.

In the preferred embodiment, only one interrupt threshold register having the same number of bits as the most significant part of the counter stored in the memory is used for interrupt generation of all counters in the array. In yet another embodiment, a group of two or more registers for holding multiple interrupt values is used for checking the interrupt condition, without departing from the scope of this invention. In the extreme case, the number of these registers equals to the number of counters, thus every counter has assigned one threshold register. In the case of multiple registers with threshold values, each counter is configurable to select one of the interrupt threshold registers.

In yet another embodiment, set of threshold registers has paired a set of registers for storing addresses of counters it is paired to. Thus, one threshold register can have assigned one or more registers to store one or more addresses i of assigned counters. In this embodiment, if the counter address matches an address i stored in an address register j, the value in the increment register is compared to the threshold value stored in the corresponding threshold register j. Other mappings of threshold registers to counters are also possible without departing from the scope of this invention.

In the preferred embodiment, the interrupt threshold register having the same number of bits as the most significant part of the counter stored in the memory is used for interrupt generating. In yet another embodiment, the number of bits in the interrupt threshold equals to the number of bits in a counter (sum of the number of bits stored in the memory and the number of bits implemented as discrete logic) and being compared to the integral value of a counter, combining the bits of the counter stored in the memory array with the bits stored in discrete register to determine if the interrupt condition is met, without departing from the scope of the invention. In yet another embodiment, any subset of bits of an integral counter value is used for determining if counter value equals the value of the threshold register, without departing from the scope of the invention.

The preferred embodiment for implementing area efficient counter array uses state machine, a memory array for storing most significant counter bits, and discrete registers for storing least significant bits of counter values. The preferred implementation updates the memory array portion of counters under control of a state machine. Thus, updating of memory array portion of counters is performed periodically.

If support for interrupt indication in a case when a counter reaches predefined threshold value is implemented, the comparison of a counter value to the threshold value will also occur only periodically. As a result, a counter comparison to a threshold value can be only performed when the full value of the counter register is available, that is when the memory array is being updated. This can lead to a long delay of event indication, which can be as long as being $2^n$ events late, where n is the number of bits held in the register portion of a counter.

To overcome this problem, the present invention describes method and apparatus for hardware device which implements pre-identification of possible interrupts to occur during the next $2^n$ events, where n is the number of bits held in the register portion of a counter, before the memory array is being updated. This is accomplished by storing pre-identification status with the indicator flag associated with each register, and as will be described below.

Figure 5:
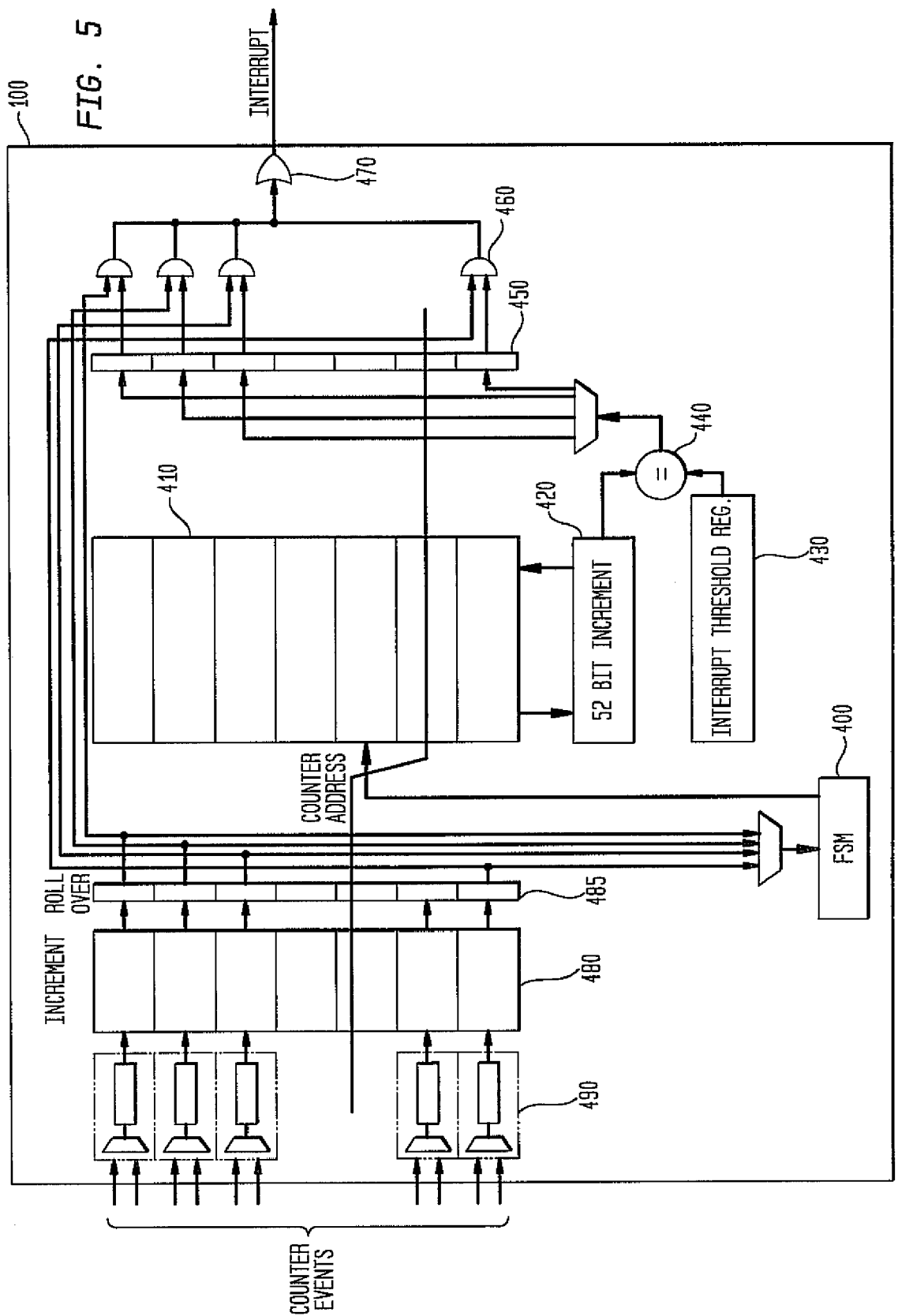
FIG. 5 is a block diagram depicting the hybrid counter array implementation with interrupt pre-indication according to the present invention.

Referring now to FIG. 5, there is depicted a high level block diagram of hybrid counter array implementation with interrupt pre-indication according to the present invention. In the preferred embodiment, the hybrid counter array comprises: a set of input multiplexers 490, to select set of events to be counted, a set of N counters being wide n bits, and being implemented using discrete registers logic 480, a memory array 410, having at least N memory locations at least K−n bits wide, where K is the number of bits in a single counter, a state machine 400 for controlling periodical updates of the memory array 410, a set of "roll over" bits 485 for capturing events that a paired counter part implemented as discrete registers had wrapped around, an increment register 420 to increment the value of the counter part stored in the memory array 410, an interrupt threshold register 430, to store the threshold value, a comparison logic 440, which identifies that the incremented counter value in the increment register equals to the value stored in the interrupt threshold register, a set of "interrupt arm" bits 450, a set of AND-gates 460, and an OR gate 470.

The invention operates as follows: to each of N counters is associated an "interrupt arm" bit 450, to enable fast interrupts, and a "roll-over" bit 485, which is set when n-bit lower part of a counter reaches the maximum value and rolls back to zero. The state machine 400 controls the operation of the counter unit 100, cycling thru all N counters. For each selected counter, if the "roll-over" bit is set, high counter bits of the counter are pulled out of the memory array, incremented, and stored back to the memory array.

High order counter bits pulled out of memory array in the increment register 420 are compared to the interrupt threshold register 430. In the early interrupt indication mode, the counter value is compared to the interrupt threshold value decremented by 1. If the interrupt threshold register decremented by one match the high order bits of the counter, the corresponding "interrupt arm" bit 450 is set. After this, the "roll-over" bit 485 is set to zero, and the next counter is selected.

Setting "interrupt arm" bit enables fast interrupt indication. This bit is set for each counter if it matches the value stored in the threshold register decremented by one. Thus, setting the bits 450 is early warning that on the next roll-over of the lower bits of a counter, the interrupt will be fired. Firing the interrupt is accomplished by AND-ing the "interrupt arm" bits 460 with the "roll over" bits 485 for each counter. If any one of the N counters from the counter array has both "interrupt arm" bits and "roll over' bits set, the corresponding signal value will be one after going true the AND gates array 450, and reduced by global OR-reduce 470, firing the interrupt. It is to be noted that the interrupt signal will be set as soon the lower bits of a counter have the "roll over" bit set for a counter whose paired "interrupt arm" bit is set, independently of the state of the control state machine 400. This potentially saves hundreds of cycles as the state machine needs to cycle thru all the counters. The single interrupt is fast if it is on the boundary of $2^n$ which is where the lower n bits will roll over.

In yet another embodiment, a set of registers for "interrupt arm" indication may store the counter indication i which triggered early interrupt indication. This implementation is preferable if a very large number of counters is present, as the number of storage elements will scale with the number of simultaneous pre-armed events supported, not with the number of total counters. Other indication schemes are also possible, without departing from the scope of this invention.

Figure 6:
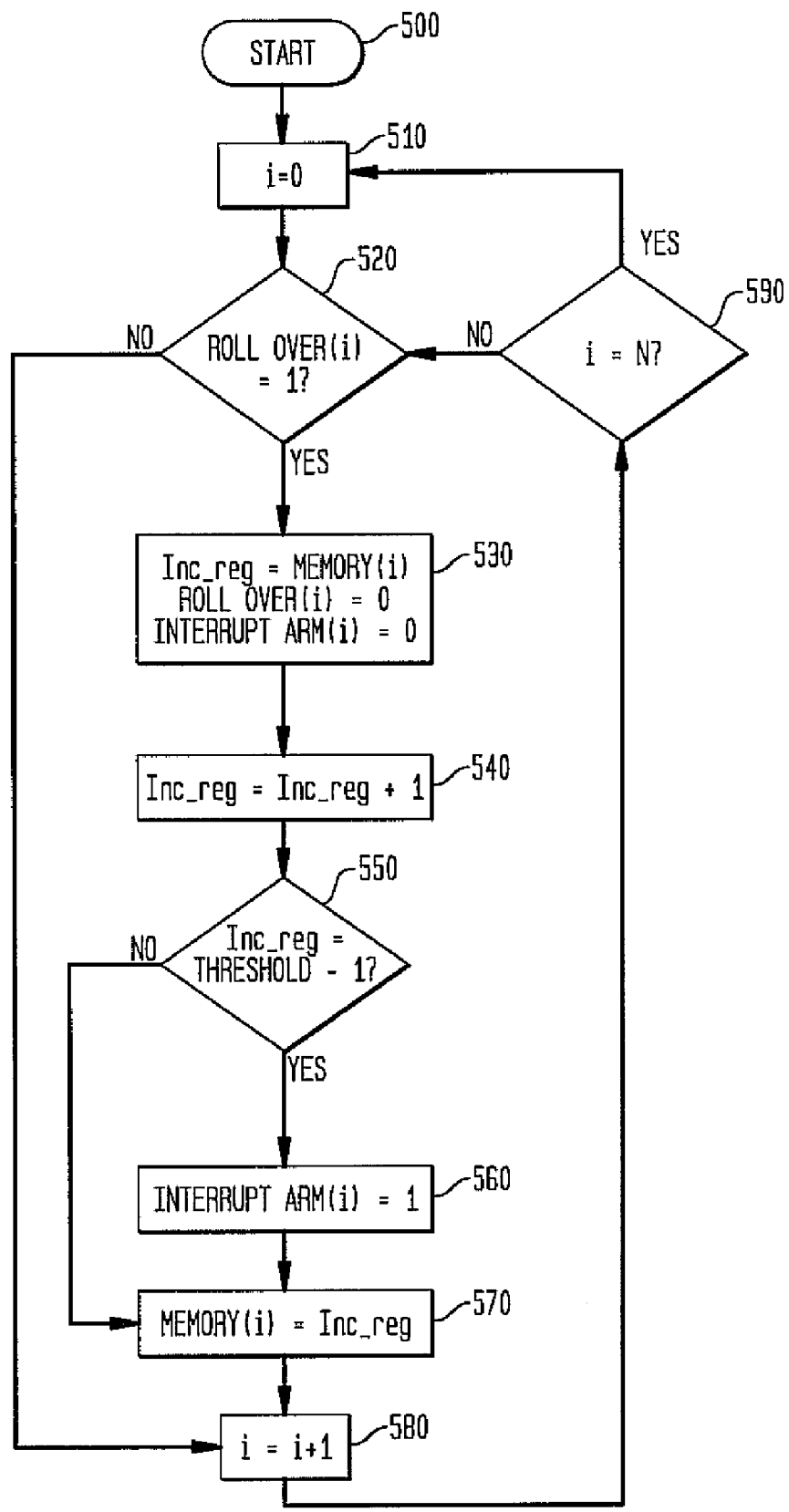
FIG. 6 is a flow chart depicting the control flow for early interrupt indication for hybrid counter array implementation according to the present invention.

Referring now to FIG. 6, the flow chart depicts the control flow for early interrupt indication for hybrid counter array implementation according to the present invention. At the start of operation at step 500 the variable i loop counter is set to zero as indicated at step 510. Then, for each counter is checked if the "roll over" bit is set. This is done one at a time, by checking the value of the "roll over" bit of the counter i, for the current variable i, at step 520.

If the 'roll over' bit of the counter i is not set—as determined at step 520-, the execution proceeds to step 580, to increment the variable i and check the next counter.

If the "roll over' bit of the counter i is set, the memory array corresponding to i-th counter is loaded in the increment register, as indicated at step 530. Also in this step, the "roll over" bit, and the "interrupt arm" bit of the i-th counter are cleared. The variable i is used to address the corresponding memory location. At step 540, the value loaded in the increment register is incremented.

At step 550, the value in the increment register is checked if it is equal to value of the threshold register decremented by one. If this is the case, the control continues to step 560, where the paired "interrupt arm" bit of the i-th counter is set. For this counter, an interrupt will be fired next time the "roll over" bit of the i-th counter is set. At step 570 the new value from the increment register is stored back to the memory location corresponding to the i-th counter, addressed by the variable i.

If at step 550, the value in the increment register does not equal to value of the threshold register decremented by one, the control continues to step 570, where the new value from the increment register is stored back to the memory location.

The execution continues by incrementing the loop variable i at step 580, and checking if all N counters have been addressed at step 590. If all N counters have already been addressed, the loop variable i is reset to zero at step 510. If not all counters have been checked for roll over bit, the operations from steps 520-580 are repeated for the next counter.

It is to be noted that, in addition to "interrupt arm" bit, each counter can have one or more assigned configuration bits to define the mode of operation of the counter, to select one from plurality of input events, and to enable or disable interrupts. In this embodiment, an interrupt signal will be raised only in the case where "interrupt enable" configuration bits are set, and the "interrupt arm" and "roll over" bits are set. In the case that interrupt is not enabled, the interrupt signal will not be set.

It is desirable to read, write or reset the counters of a counter unit. This is accomplished by adding additional actions to the control state machine. To avoid the need for a second memory port (and thereby significantly increasing the size of the storage array), processor requests must be synchronized with rollover bit handling. This is achieved by testing for pending processor memory requests periodically. In the preferred embodiment, pending read- and write requests to the counters are performed on each counter update, once per counter update cycle independently if the counter is updated or not. In yet another embodiment, the counter update phase can be implemented with lower frequency, once every J, J>1 update cycles, or once for the whole cycle for updating all N counters, without departing from the scope of the invention.

Figure 7:
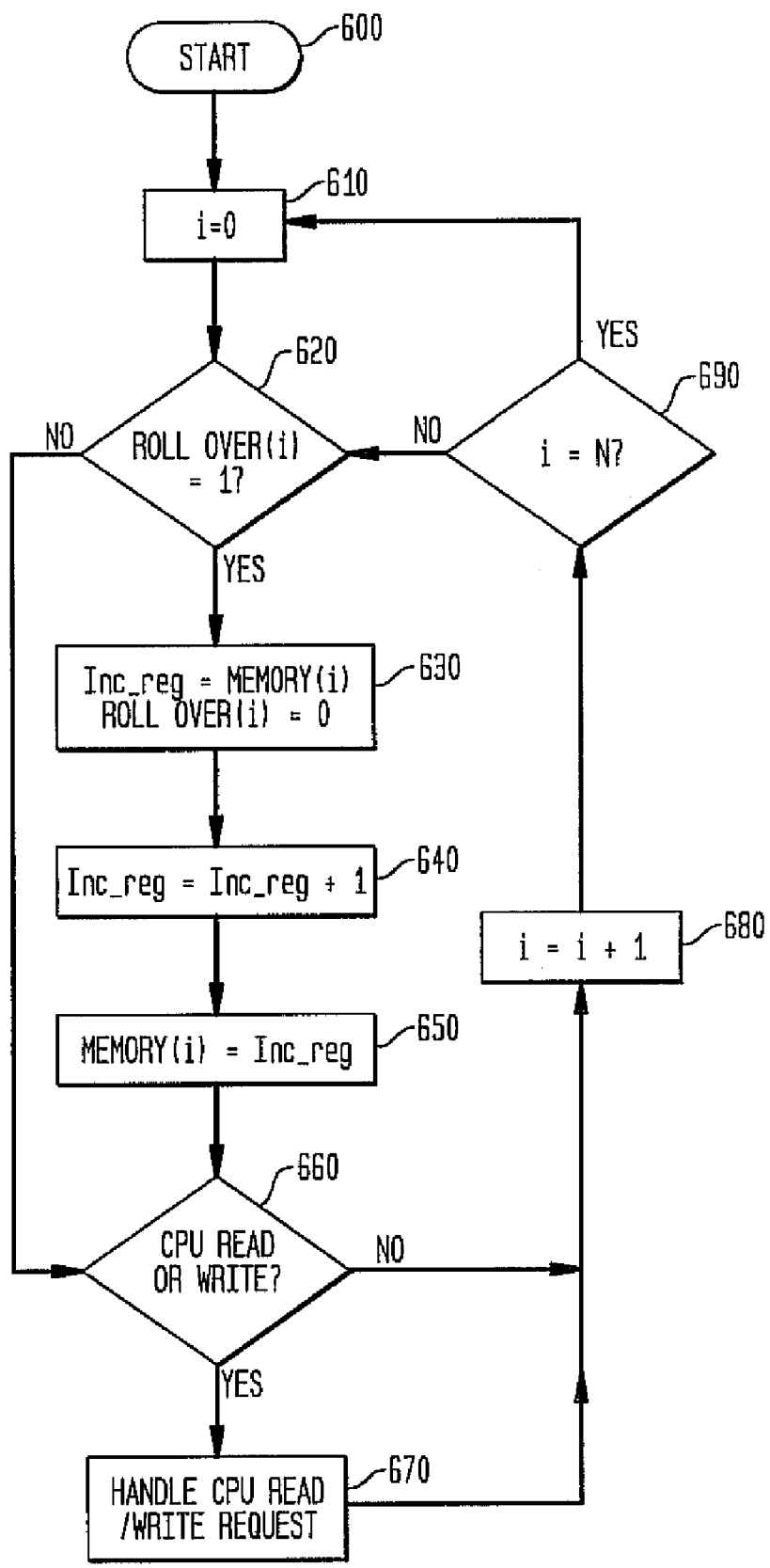
FIG. 7 depicts the control flow process for enabling one or more processors in a single- or multi-processor system to access counter values, in order to read, write or reset the counters of the counter unit.

Referring now to FIG. 7, there is depicted the control flow process for enabling to one or more processors in a single- or multi-processor system to access counter values, in order to read, write or reset the counters of the counter unit. It is desirable that one or more processors can read counter values, or to set counter values to some pre-defined value. At the start of operation at step 600 the variable i loop counter is set to zero as indicated at step 610. Then, for each counter is checked if the "roll over" bit is set. This is done one at a time, by checking the value of the "roll over" bit of the counter i, for the current variable i, at step 620.

If the "roll over' bit of the counter i is set, the memory array corresponding to i-th counter is loaded in the increment register, as indicated at step 630. Also in this step, the "roll over" bit of the i-th counter is cleared. The value loaded in the increment register is incremented in step 640, and at step 650 the new value from the increment register is stored back to the memory location corresponding to the i-th counter.

Returning back to step 620, if the 'roll over' bit of the counter i is not set, the execution proceeds to step 660, to check if there is any memory requests from the processor pending. At step 660, the check is made if one of the processor has issued read or write command to any of the counters in the counter array. If a memory request is pending, the CPU read- or write access to a counter j is handled in step 670, and the control continues to step 680. If no processor read- or write access is pending, the control continues to step 680.

To retrieve value form any of hybrid counters to a processor, the both parts of the counter have to be retrieved and assembled: the least significant part of the counter stored in discrete registers, and the more significant part of the counter stored in the memory array. Only after both parts of the counter have been retrieved, the counter value can be returned to the requesting processor. Similarly, on a counter write, the written data are split into two parts: the least significant part to be stored in the discrete registers of the counter, and the most significant part of the counter value to be stored in the memory array.

While the part of a counter stored in discrete latches can be retrieved immediately, the value stored in the memory array can be accessed only at this step 670. Thus, the counter value retrieved from the memory and assembled with the part stored in the discrete register can be returned to the requesting processor only after the step 670 for memory access is finished, independently from the cycle in which the request was received. Similarly, any value to be written in a counter has to be stored temporally in a register until the control state machine reaches the state 670 to handle memory access.

The execution continues by incrementing the loop variable i at step 680, and checking if all N counters have been addressed at step 690. If all N counters have already been addressed, the loop variable i is cleared at step 610. If not all N counters have been checked for roll over bit, the operation from steps 620-670 is repeated for the next counter.

The CPU interface can be implemented over a variety of architected bus widths. When interfacing a counter unit with counters being 64 bits width with a bus having 64 bits or more, a single access can read or write a single event counter in one bus transaction.

For a write access, following actions are performed:

lower 12 bits of a write word are written into the 12 least significant bits of a counter which are implemented as discrete registers—performed immediately, higher 52 bits are written into the SRAM memory array—performed only when the state machine is in the "handle CPU read/write request" state (state 670 in FIG. 7).

Until this state is reached, the word to be written is placed in a staging local register.

For a read access, following actions are performed:
higher 52 bits are read out of the SRAM memory array—performed only when the state machine is in the "handle CPU read/write request" state (state 670 in FIG. 7),
lower 12 bits are read out of the 12 least significant bits of a counter which are implemented as discrete registers—performed simultaneously with the memory read.

When interfacing the counter unit with counters being 64 bits width with a bus with less than 64 bits, a read-or write-access to event counters in the counter unit cannot be performed in one bus transaction. Such a scenario happens if a bus is being architected to only support transactions of a certain bit width less than 64 bits, or if a bus is architected as a wide 64 bit bus, but a counter value is requested by a bus master which supports only narrow transactions.

Specifically, for a 64 bit counter unit and 32 bit bus transactions, a read cannot return the entire 64 bit counter value to the requester (e.g., a CPU) in a single read bus transaction, and a write cannot supply the 64 bit data to be written to a counter in a single bus transaction. To resolve this, an alternative solution is needed.

The problem of accessing wider registers via a narrow bus is not a novel problem. One possible solution is to split wide registers into separately accessible sub-registers. In this approach, a write operation is implemented to write a first set of bits to a first address, and a second set of bits to a second address.

However, this simple solution is not appropriate for the hybrid counter array unit. This approach requires arbitration with the roll-over update logic of the control state machine, needing 2 arbitration cycles to write data to the memory array. If using control state machine, as described in the preferred embodiment, two cycles for memory updates are needed to store the wide value into the memory. This solution also requires a memory storage array with sub-words which can be written independently. As a result of implementation with independent sub-words, separate parity codes have to be maintained for each sub-word, instead of having one parity code, or ECC code, or some other memory data protection codes assigned per each memory word. Alternatively, a read-modify-write cycle could be implemented, which increases the latency and response time. In this approach, data are read, partly overwritten and stored back to the memory. One further aspect of writing sub-words, if an overflow from one slice to the next is possible, additional constraints are to be observed to avoid race conditions.

Alternatively, to access wider registers via a narrow bus a solution using two staging registers and a control register can be used. An example of this solution is found in 6526 Complex Interface Adapter CIA by Commodore for read and write access to counters, and more specifically for timers and time of day clocks.

In this solution, the timer is updated atomically from a latched staging register, by writing a first and second byte of a two-byte timer word contained in registers 4 and 5 (Timer A), and registers 6 and 7 (Timer B), respectively. A write of a control register 14 (CRA, for Timer A), and register 15 (CRB for Timer b) wherein bit 4 is set, forces a load of the 16 bit two-word latch into the counter. Alternate modes (such as continuous mode) of updating the counters automatically from the latch are also presented.

However, the most serious disadvantage of this solution is that it causes excessive overhead. This solution requires to perform three write requests to write one 16 bit value (two split one byte values plus the control word), resulting in inefficient use of bus bandwidth. Efficient bus bandwidth usage is especially important in a multiprocessor environment.

An alternate method for updating a counter is shown for the "Time of day" feature of the referenced part (registers 8, 9, 10, 11 containing tenths of seconds, seconds, minutes, and hours, respectively, in BCD format). In this solution, write access to the hour register (register 11) will stop operation of the clock feature. A write to the tenths of seconds register (register 8) will resume operation of the clock.

While this approach does not cause bus inefficiency, it requires storing internal state about whether the counter has been currently started or stopped. To apply this solution to the counter array unit, additional state information—if the counter is currently being written, or it is in a counter mode—has to be added to each counter. This approach thus requires additional state to store the enable/disable mode of each counter, which can be significant for a big number of counters in the counter unit. In addition, stopping the counters has undesirable effect of loosing counter events—as long a counter is in this alternate state, the counters do not count events, and all counter events happening during this time are lost.

In accordance with the present invention, this invention teaches a bus bandwidth efficient solution for memory access of wide counters (64 bits wide) in the counter unit via a narrow (32 bit) bus. The invention provides a first staging latch containing 32 bits, an array to be updated, control circuitry to deposit 32 bits of data from a data bus port into a staging latch addressed using a specific register address, other control circuitry to merge 32 bit data contained in a staging latch with 32 bit data from a data bus port, to generate 64 bit data to write atomically, to a counter specified by a register address.

Referring now to FIG. 8A, there is depicted a high level block diagram of a wide memory array implementation supporting memory accesses via a narrow bus in accordance with the present invention. In the preferred embodiment, the invention provides a 64 bit wide array 710 to be updated, a staging register 730 containing 32 bits, control circuitry 720 to deposit 32 bits of data from a data bus port into a staging register 730 addressed using a specific register address S, and control circuitry to merge 32 bit data contained in a staging register 730 with 32 bit data from a data bus port, to generate 64 bit data to write atomically, to a counter specified by a register address Ai.

In accordance with the present invention, a single write access to the memory array 710 by a processor or other bus master is implemented as follows:

1. first set of bits is written to the staging register 730 by providing as target address of a write (store) operation the address S of the staging register 730,
2. then provide a subsequent set of bits (the remaining bits) together with an array element target specification (encoded as a plurality of the bits of the address specified in the write transaction), in a subsequent write transaction (store).

More specifically, in reference to FIG. 8A, to perform a single write access to the memory array, two write bus transactions are performed. First write bust transaction is targeting the staging register, using the address "S" of the staging register and writing 32 bit wide data from the bus into the staging register 730. The control circuitry 720 generates needed control signals (such as "write" and "Select" signals) to deposit 32 bits of data from a data bus port into a staging register 730.

The second write bus transaction is addressing the target memory location. To write data into the memory address Ai, the address "Ai" of the target memory location, and remaining 32 bits of the word to be written in the memory location Ai, are placed on the data bus. The control circuitry 720 decodes the address, generates needed control signals to write data into the memory array 710 (such as "write" and "select" signals), enabling writing of 32 bit data contained in a staging register 730 with 32 bit data from a data bus port, to generate 64 bit data to write atomically to a memory location specified by a register address Ai.

Referring now to FIG. 8B, a block diagram of logic needed to perform a single read access to the memory array is depicted. In the preferred embodiment, the invention provides a 64 bit wide array 710 to be read out, a staging register 740 which is 32 bits wide, control circuitry 720 to deposit 32 bits of data from the staging register 740—which is addressed using a specific register address S1 into a data bus port, and control circuitry to deposit 32 bit data from the memory array 710 specified by a register address Ai which are not captured in a staging register 740 into a data bus port.

To perform a single read access from the memory array 710, two read bus transactions are performed. First read bust transaction is addressing the target memory location Ai. To read data from the memory address Ai, the address "Ai" is placed on the data bus. The control circuitry 720 decodes the address, generates needed control signals to read data from the memory array 710 (such as "read" and "select" signals). When 64 bit data from the memory location Ai are available, one 32 bit data part are written in the staging register 740, and the second 32 bit data part is driven into a 32 bit data bus port, by driving the control signals to properly select the multiplexer 750.

The second read bus transaction is addressing the staging register 740, using the address "S1" of the staging register and reading 32 bit wide data from the staging register 740 into the data bus port. The control circuitry 720 decodes the address, generates needed control signals to read data from the staging register 740 and the multiplexer 750. Thus, these two transactions enable reading of any memory location in the memory array 710.

Referring now to FIGS. 9A and 9B, there are shown hardware methods for writing and reading data elements of a memory array, such as may be used to advantageously implement the counter unit in one exemplary embodiment.

For example, as shown in FIG. 9A, there is depicted method steps 800 for writing data elements to the memory array elements 710 as depicted in FIG. 8A. As shown in FIG. 9A, two steps 810 and 820 representing a first data bus write transaction is performed with the first step 810 of first receiving a write request at the staging register 730 at a predetermined address, e.g., address S. Then, as depicted at step 820, a first number of bits, e.g., 32 bits, from the narrow data bus are written to the staging register 730 for temporary storage thereat. Then, as depicted at steps 830 and 840 representing a second data bus write transaction, a second write request is received at step 830 for writing the remaining data bits on the narrow data bus to address Ai (indicating element i in the memory array block 710 of FIG. 8A). Then, as depicted at step 840, the contents of the staging register are combined with the data from the data bus and an atomic write operation is performed to write this data into the memory array at a selected address corresponding to array element i.

For a memory read transaction, as shown in FIG. 9B, there is depicted method steps 850 for reading data elements from a memory array element 710 as depicted in FIG. 8B. As shown in FIG. 9B, steps 860-875 represent a first data bus read transaction with a first step 860 representing the step of receiving a read request from a memory address location, e.g., address Ai (indicating element i in the memory array block 710 of FIG. 8B). Then, at step 865, a predetermined number of bits, e.g., 64 bits, are read from array element i. Then, as depicted at step 870, one-half of the retrieved bits, e.g., 32 bits, are first placed on the data bus from the memory array while, at step 875, the remaining bit data, e.g., second 32 bit data item, is stored in the staging register 740, e.g., at a predetermined address S1. Then, as depicted at steps 880 and 885 representing a second data bus read transaction, a second read request is received at step 880 for reading the data from address S1 of the staging register. In response, at step 885, the remaining bit data, e.g., second 32 bit data item, stored at the staging register 740 is placed on the narrow data bus for input to a requesting processor, for example.

Figure 10A:
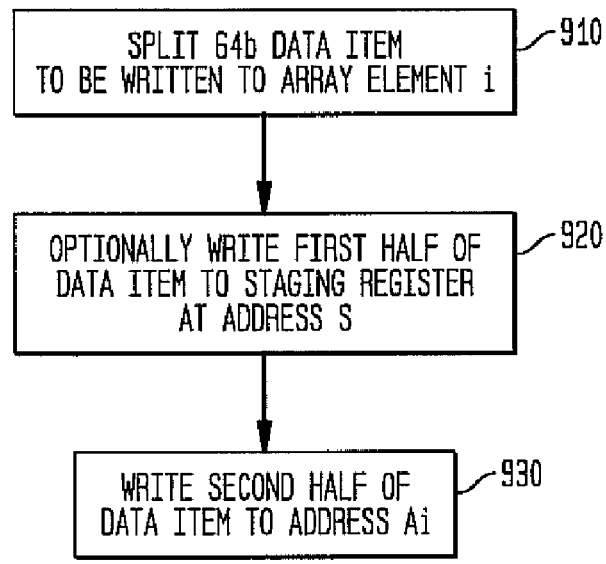
Figure 10B:
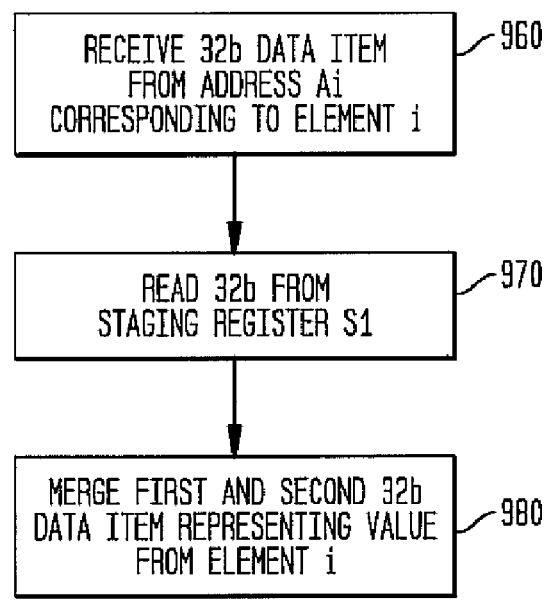

Referring now to FIGS. 10A, 10B, and 10C, there are shown software methods for writing data elements, reading data elements, and performing a read-modify-write cycle on data elements of a memory array, such as may be used to advantageously utilize a counter unit in one exemplary embodiment. For example, as shown in FIG. 10A, there is depicted method steps 900 for writing data elements to an array element. For example as shown at step 910, FIG. 10A, a predetermined data item, e.g., 64 bits, to be written to array element i is split, for example, in half. Then, in an optional step depicted as step 920, the first half of the data item, e.g., 32 bits, is written to the staging register at an address S (such as staging register 730 of FIG. 8A). The second half of the data item, e.g., remaining 32 bits, is then written to the address Ai as indicated at step 930.

Referring now to FIG. 10B, there is depicted method steps 950 for reading data from the array elements. For example as shown at step 960, FIG. 10B, a predetermined data item, e.g., 32 bits are first received form the address Ai corresponding to element i in the memory array 710. Then, as depicted at step 970, the first half of the data item, e.g., 32 bits, are read from the staging register from an address S1 (such as staging register 740 of FIG. 8B). Then, as indicated at step 980, the first predetermined data item (e.g., 32 bits) are merged with the second 32 bit data item representing the value from element i in the memory array.

Referring now specifically to FIG. 10C, and method 990, there is shown a method for performing a read-modify-write cycle. In accordance with this embodiment, staging registers S and S1 for write and read access are implemented as a single register S, advantageously allowing efficient read-modify-write cycles to be performed.

In accordance with method 990, a read step is performed. The method starts with step 993. The read step 993 returns a first data portion on the data bus corresponding to a data read request from element i, and write updates a staging register S with a second data portion. The write step 996 supplies a data update portion, to be combined with said data retained in staging register S during read step 993, and the combined data is written to the specified element j. In one embodiment, i=j.

Advantages of the present invention are: a counter is updated atomically to avoid race conditions; the need for read-modify-write cycles is eliminated; the need for the ability to perform sub-word writes is eliminated; only two bus transactions are needed, i.e., the minimum number to transport a 64 bit datum over a 32 bit data bus.

In one optimized embodiment, the first set of bits is the high order bits. Advantageously, this allows a set of numbers in the range from 0 to $2^{32}-1$ to be written in a single bus transactions.

This solution implements a high performance reset operation of counters, resetting a plurality of counters (i.e., initialized to the value 0). The rest is implemented as follows: (step 1) preload 0 into the staging latch as a first set of bits; (step 2) writing 0 as remaining bits, specifying as address an address indicating the counter to be initialized. To initialize a plurality of counters, only step 2 is repeated for all counters, writing 0 as counter bits and specifying counter address of each counter to be initialized. Thus, to initialize N 64 bit wide counters, only N+1 narrow 32 bit wide bus accesses are required. The same efficient initialization process is performed for initializing a set of counters with any arbitrary number, with the constraint that most significant k bits are the same, where k is the register width. An example of such initialization is writing small positive or negative numbers into counters.

The same methods and apparatus can be applied to any update having a first bus width n and a second data width m (n<m). In other embodiment, where multiple bus transactions n width have to be performed for updating data width m, a first transaction can supply a first set of bits, a second transaction a second set of bits, and so forth, until a final transaction specifies a final set of remaining bits and a specific data element.

Referring now to FIG. 11, there is shown an apparatus 1000 implementing the hybrid counter unit for efficient monitoring of large number of simultaneous events for a uniprocessor or multiprocessor system, or a system on a chip. The hybrid counter unit depicted in FIG. 11 is a combination of the individual system components as depicted in FIGS. 2, 4, 5 and 8A and 8B. In one embodiment, the counter unit consists of an SRAM memory array and a set of discrete registers for implementing a counter array as described herein. Usage of SRAM for implementing event monitoring unit enables power-efficient implementation compact in area. This departs from traditional implementations of counter units using on latch-based counters. That is, in prior art implementations, a number of counters was extremely limited due to power and area use of counter units. Using the monitoring unit based on the memory array implementation according to the invention, the power and area limitations are alleviated, and implementation with significant number of large counters capable of simultaneous tracking of large number of events is enabled.

To reduce the SRAM memory update rate, low-order bits of the counters are partitioned from the high-order bits. The high-order bits are stored in the memory array which is periodically updated, whereas the low-order bits are implemented using latch-based discrete logic. The high-order bits are updated when the low order bits overflow. The updating of high-order bits is controlled by a state machine. The invention teaches a fast interrupt trigger architecture. In one aspect of the invention of fast interrupts, there is provided a method to identify impending interrupts, and indicate this interrupt pending condition. As soon as a counter for which an interrupt is enabled reaches the value stored in the interrupt threshold, if impending interrupt for this counter has been identified. The interrupt is triggered when the counter, for which interrupt is enabled and for which impending interrupt is indicated, reaches the overflow of the low order bits of the counter. This architecture allows for fast response when interrupts trigger.

Yet another aspect of this architecture is the efficient usage of narrow bus. The architecture allows attaching the monitoring unit over a narrow bus—a bus whose width is half of the width of the counters in the monitoring unit. The present invention teaches how to enable accessing the counters in the monitoring unit for initialization and status access. The proposed method minimizes the number of stage registers, and the number of needed bus transactions to accomplish these operations.

While the here disclosed invention teaches usage of large counter arrays using memory arrays for counting the large number of individual events in a computer system, such as processors, memory system, and network I/Os, and is described as such in the preferred embodiment, the invention is not limited to that particular usage. It can be equally well applied by anybody skilled in the art to communication network systems where large volume of packets of information is passed from port to port, and the communication quality, or other aspects of communication have to be evaluated based on the number of packets which are delivered or discarded, or based on some other information relating to the operation of the network system.

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention.

Having thus described our invention, what we claim as new, and desire to secure by Letters Patent is:

1. A method for counting events in a computer system comprising:
    providing a first counter portion comprising N counter devices, each counter device for receiving signals representing occurrences of events from N sources and providing a first count value corresponding to a lower order bits of said hybrid counter array;
    providing a second counter portion comprising a memory device having N addressable memory locations in correspondence with said N counter devices, each said addressable memory location being for storing a second count value representing higher order bits of said hybrid counter array;
    monitoring, by a control device, each of said N counter devices of said first counter portion and initiating updating a value of a corresponding said second count value stored at said corresponding addressable memory location in said second counter portion,
    wherein a combination of said first and second count values provide instantaneous measure of number of events received.

2. The method as claimed in claim 1, wherein said memory array device comprises a hierarchical arrangement of multiple memory blocks such that a first predetermined number of circuit means in said second counter portion corresponds to a first memory array in said second counter portion and, a second predetermined number of circuit means corresponds to a second memory array in said second counter portion for each memory block in the said memory array.

3. The method as claimed in claim 1, wherein said control means comprises a finite state machine, said finite state machine monitoring all N counter devices in a cycle.

4. The method as claimed in claim 1, further comprising:
    setting an overflow bit means associated with each respective counter device in response to an associated counter device reaching overflow condition.

5. The method as claimed in claim 4, further comprising:
    monitoring each of said N associated overflow bit means of said first counter portion and incrementing a value of a corresponding said second count value stored at said corresponding addressable memory location in said second counter portion in response to a respective overflow bit being set.

6. The method as claimed in claim 4, wherein said control means comprises a finite state machine, said finite state machine monitoring all N overflow bits in a cycle.

7. The method as claimed in claim 4, further comprising:
providing an incrementing register device adapted for receiving a current second count value contained in an $i^{th}$ addressable memory location in response to a corresponding overflow bit being set in an associated $i^{th}$ counter device; and
incrementing said second count value in said incrementing register device; and
loading said incremented second count value back in said $i^{th}$ addressable memory location.

8. The method as claimed in claim 7, further comprising:
resetting said overflow bit after initializing increment of the corresponding associated counter device.

* * * * *